United States Patent
Adnan et al.

(10) Patent No.: US 11,848,378 B2
(45) Date of Patent: Dec. 19, 2023

(54) SPLIT-GATE TRENCH POWER MOSFET WITH SELF-ALIGNED POLY-TO-POLY ISOLATION

(71) Applicant: STMicroelectronics Pte Ltd, Singapore (SG)

(72) Inventors: Ditto Adnan, Singapore (SG); Maurizio Gabriele Castorina, Singapore (SG); Voon Cheng Ngwan, Singapore (SG); Fadhillawati Tahir, Singapore (SG)

(73) Assignee: STMicroelectronics Pte Ltd, Singapore (SG)

( * ) Notice: Subject to any disclaimer, the term of this patent is extended or adjusted under 35 U.S.C. 154(b) by 147 days.

(21) Appl. No.: 17/373,198

(22) Filed: Jul. 12, 2021

(65) Prior Publication Data

US 2022/0052194 A1 Feb. 17, 2022

Related U.S. Application Data

(60) Provisional application No. 63/065,198, filed on Aug. 13, 2020.

(51) Int. Cl.
*H01L 29/78* (2006.01)
*H01L 21/765* (2006.01)
(Continued)

(52) U.S. Cl.
CPC ........ *H01L 29/7813* (2013.01); *H01L 21/765* (2013.01); *H01L 29/401* (2013.01); *H01L 29/407* (2013.01); *H01L 29/66734* (2013.01)

(58) Field of Classification Search
CPC .............. H01L 29/407; H01L 29/7813; H01L 29/66734; H01L 29/42376; H01L 29/4236
See application file for complete search history.

(56) References Cited

U.S. PATENT DOCUMENTS 6,259,131 B1 7/2001 Sung et al.
6,313,500 B1 11/2001 Kelley et al.
(Continued)

FOREIGN PATENT DOCUMENTS

WO 2008036603 A1 3/2008

OTHER PUBLICATIONS

EP Search Report and Written Opinion for family-related application, EP Appl. No. 21189249.2, report dated Dec. 20, 2021, 11 pages.

*Primary Examiner* — Joseph C. Nicely
(74) *Attorney, Agent, or Firm* — CROWE & DUNLEVY

(57) ABSTRACT

A semiconductor substrate has a trench extending from a front surface and including a lower part and an upper part. A first insulation layer lines the lower part of the trench, and a first conductive material in the lower part is insulated from the semiconductor substrate by the first insulating layer to form a field plate electrode of a transistor. A second insulating layer lines sidewalls of the upper part of said trench. A third insulating layer lines a top surface of the first conductive material at a bottom of the upper part of the trench. A second conductive material fills the upper part of the trench. The second conductive material forms a gate electrode of the transistor that is insulated from the semiconductor substrate by the second insulating layer and further insulated from the first conductive material by the third insulating layer.

25 Claims, 5 Drawing Sheets

(51) Int. Cl.
    *H01L 29/40*         (2006.01)
    *H01L 29/66*         (2006.01)

(56) References Cited

U.S. PATENT DOCUMENTS

| | | |
|---|---|---|
| 6,420,232 B1 | 7/2002 | Wu |
| 6,479,859 B2 | 11/2002 | Hsieh et al. |
| 6,525,369 B1 | 2/2003 | Wu |
| 6,538,277 B2 | 3/2003 | Sung et al. |
| 6,573,142 B1 | 6/2003 | Hsieh |
| 6,753,569 B2 | 6/2004 | Lin et al. |
| 8,466,025 B2 | 6/2013 | Zeng et al. |
| 8,680,614 B2 | 3/2014 | Li et al. |
| 2004/0089910 A1* | 5/2004 | Hirler ................ H01L 29/407 |
| | | 257/500 |
| 2007/0037327 A1* | 2/2007 | Herrick .............. H01L 29/7813 |
| | | 438/151 |
| 2007/0155104 A1 | 7/2007 | Marchant et al. |
| 2010/0044785 A1 | 2/2010 | Murphy et al. |
| 2011/0133258 A1 | 6/2011 | Chen |
| 2016/0300917 A1 | 10/2016 | Xue et al. |
| 2020/0212218 A1* | 7/2020 | Kim ................... H01L 29/1095 |
| 2020/0295150 A1* | 9/2020 | Nishiwaki ......... H01L 29/66727 |
| 2021/0234039 A1* | 7/2021 | Tegen ................ H01L 29/7827 |
| 2022/0328658 A1* | 10/2022 | Yao .................. H01L 29/66727 |
| 2023/0072989 A1* | 3/2023 | Nagata ................ H01L 29/404 |
| 2023/0087151 A1* | 3/2023 | Grebs ................. H01L 29/407 |

\* cited by examiner

SPLIT-GATE TRENCH POWER MOSFET WITH SELF-ALIGNED POLY-TO-POLY ISOLATION

CROSS REFERENCE TO RELATED APPLICATION

This application claims priority from U.S. Provisional Application for Patent No. 63/065,198, filed Aug. 13, 2020, the disclosure of which is incorporated by reference.

TECHNICAL FIELD

The present invention generally relates to metal oxide semiconductor field effect transistor (MOSFET) devices and, in particular, to a split-gate trench power MOSFET device.

BACKGROUND

Reference is made to FIG. 1 which shows an embodiment of a cross-section of a split-gate trench power metal oxide semiconductor field effect transistor (MOSFET) device 10. In this example, the MOSFET device 10 is an n-channel (nMOS) type device formed in and on a semiconductor substrate 12 (for example, silicon) doped with n-type dopant providing the drain region of the transistor 10. The substrate 12 has a front side 14 and a back side 16. A plurality of trenches 18 extend depthwise into the substrate 12 from the front side 14. The trenches 18 extend lengthwise parallel to each other in a direction perpendicular to the cross-section (i.e., into and out the page of the illustration), with adjacent trenches delimiting side edges of a mesa region 13 of the transistor forming a strip (this type of transistor device commonly referred to in the art as a strip-FET type transistor).

A region 24 doped with a p-type dopant is buried in the mesa region 13 of the substrate 12 at a depth offset from (i.e., below) the front side 14 and positioned extending parallel to the front side 14 on opposite sides of each trench 18. The doped region 24 forms the body (channel) region of the transistor, with the trench 18 passing completely through the doped body region 24 and into the substrate 12 below the doped body region 24. A surface region 26 heavily doped with an n-type dopant is provided in the mesa region 13 at the front side 14 of the substrate 12 and positioned extending parallel to the front side 14 on opposite sides of each trench 18 and in contact with the top of the doped body region 24. The doped region 26 forms the source region of the transistor, with the trench 18 passing completely through the doped source region 26 and further extending, as noted above, completely through the doped body region 24 into the substrate 12 below the doped body region 24.

The side walls and bottom of each trench 18 are lined with a first insulating layer 20. For example, the first insulating layer 20 may comprise an oxide layer (which, in an embodiment, is made up of both an oxide thermally grown from the exposed surfaces of the substrate 12 in each trench 18 and a deposited oxide). Each trench 18 is filled by a first polysilicon material 22, with the first insulating layer 20 insulating the first polysilicon material 22 from the substrate 12. During the process for fabricating the transistor 10, an upper portion of the first insulating layer 20 (which would be adjacent to both the doped body region 24 and doped region 26, for example) is removed from an upper part of the trench 18 to expose a corresponding upper portion 22a of the first polysilicon material 22 and form an annular trench surrounding the upper portion 22a. The side walls (inner and outer) of the annular trench are lined with a second insulating layer 30a and third insulating layer 30b. For example, the second and third insulating layers 30a, 30b may each comprise an oxide layer (which, in an embodiment, is thermally grown from the exposed surfaces of the substrate 12 in each annular trench and the exposed surfaces of the upper portion 22a of the first polysilicon material 22). The remaining open portion of each annular trench is then filled by a second polysilicon material 32, with the second insulating layer 30a insulating the polysilicon material 32 from the substrate 12 and the third insulating layer 30b insulating the polysilicon material 32 from the upper portion 22a. The first polysilicon material 22 in a lower part of the trench 18 forms a field plate electrode of the transistor 10. The second polysilicon material 32 in the upper part of the trench 18 forms the gate of the transistor 10 and extends on opposite sides of the upper portion 22a. The second insulating layer 30a forms the gate oxide layer.

A stack 40 of layers is formed over each trench 18 and laterally extends on opposite sides of each trench 18 over at least a portion of the doped regions 26 for the source. Each stack 40 comprises a dielectric region formed by an undoped oxide (for example, tetraethyl orthosilicate (TEOS)) layer 44 and a glass (for example, borophosphosilicate glass (BPSG)) layer 46.

A source metal contact 50 extends between adjacent stacks 40 to make electrical contact with each doped source region 26. Each source metal contact 50 extends depthwise into the substrate from the front side 14 to pass through the doped source region 26 and into the doped body region 24 (thus providing a body contact for the transistor 10 that is tied to the source). A source metal layer 52 extends over both the stacks 40 and the source metal contacts 50 to provide a metal connection to all the source metal contacts 50. The stack 40 insulates the source metal layer 52 and the source metal contacts 50 from the gate (polysilicon region 32). An electrical connection (not explicitly shown but schematically illustrated by dotted line 55) is provided to electrically connect the source metal layer 52 to the field plate (polysilicon region 22a). A drain metal layer 54 extends over the back side 16 of the substrate 12 to provide a metal connection to the drain. A gate metal layer (not explicitly shown as it is offset in a direction perpendicular to the cross-section) makes an electrical connection to the gate (polysilicon region 32) in each trench 18, this gate metal layer and electrical connection being schematically shown by dotted line 56.

The transistor 10 could instead be a pMOS type transistor where the substrate 12 and doped source region 16 are both p-type doped and the body region 14 is n-type doped.

A scanning electron micrograph (SEM) cross-sectional image of a single cell of the transistor 10 is shown in FIG. 2. There is a desire to lower the threshold voltage of the power MOSFET 10. To achieve this, the thickness of the gate oxide formed by the second insulating layer 30a between the gate (polysilicon region 32) and the substrate 12 in the upper part of the trench 18 (specifically in the annular trench region) must be thin. As an example, if the thickness of the gate oxide is thinned from about 750-800 Å to about 450-500 Å, there is a corresponding reduction in the threshold voltage from about 3.5V to about 1.75V. The thermal oxidation process used to form the second insulating layer 30a affects not only the thickness of the gate oxide but also the isolation between the gate (polysilicon region 32) and the field plate electrode (polysilicon region 22) provided by third insulating layer 30b. In particular, there is a concern that in providing a thinner second insulating layer 30a in order to reduce the threshold voltage there would be a corresponding thinning of the third insulating layer 30b in the region 70, with this thinned insulation layer resulting in a weak poly-to-poly isolation. The transistor 10 then experiences an unacceptable level of gate-to-source leakage current (IGSS) in response to the application of a gate voltage.

There is accordingly a need in the art for an improved split-gate trench MOSFET structure that supports a lower threshold voltage while continuing to satisfy gate-to-source leakage current requirements.

SUMMARY

In an embodiment, a method comprises: forming a trench in a semiconductor substrate; lining the trench with a first insulation layer; filling the trench with a first conductive material insulated from the semiconductor substrate by said first insulating layer; recessing the first insulation layer to expose an upper portion of the first conductive material within an annual trench portion of said trench; filling the annular trench portion with a resist material; developing the resist material in the annular trench portion to expose an uppermost part of the upper portion of the first conductive material leaving residual resist on sidewalls of the trench which are spaced apart from said uppermost part and define a mask; etching using said mask to remove the upper portion of the first conductive material to a level of the recessed first insulation layer; removing the resist material to open an upper part of said trench; lining sidewalls of the upper part of said trench with a second insulating layer; lining a top surface of the first conductive material at a bottom of said upper part of said trench with a third insulating layer; and depositing a second conductive material in said upper part of said trench, said second conductive material insulated from the semiconductor substrate by said second insulating layer and insulated from the first conductive material by said third insulating layer.

In an embodiment, a method comprises: forming a trench in a semiconductor substrate; lining a lower part of the trench with a first insulation layer; filling the lower part of the trench with a first conductive material insulated from the semiconductor substrate by said first insulating layer; lining sidewalls of an upper part of said trench with a second insulating layer; lining a top surface of the first conductive material at a bottom of said upper part of said trench with a third insulating layer; and depositing a second conductive material in said upper part of said trench, said second conductive material insulated from the semiconductor substrate by said second insulating layer and insulated from the first conductive material by said third insulating layer.

In an embodiment, an integrated circuit comprises: a semiconductor substrate having a front surface and a back surface; a trench extending into the semiconductor substrate from the front surface, said trench including a lower part and an upper part; a first insulation layer lining the lower part of the trench; a first conductive material in the lower part of the trench and insulated from the semiconductor substrate by said first insulating layer; a second insulating layer lining sidewalls of the upper part of said trench; a third insulating layer lining a top surface of the first conductive material at a bottom of said upper part of said trench; and a second conductive material in said upper part of said trench, said second conductive material insulated from the semiconductor substrate by said second insulating layer and insulated from the first conductive material by said third insulating layer.

BRIEF DESCRIPTION OF THE DRAWINGS

For a better understanding of the embodiments, reference will now be made by way of example only to the accompanying figures in which.

DETAILED DESCRIPTION

Figure 1:
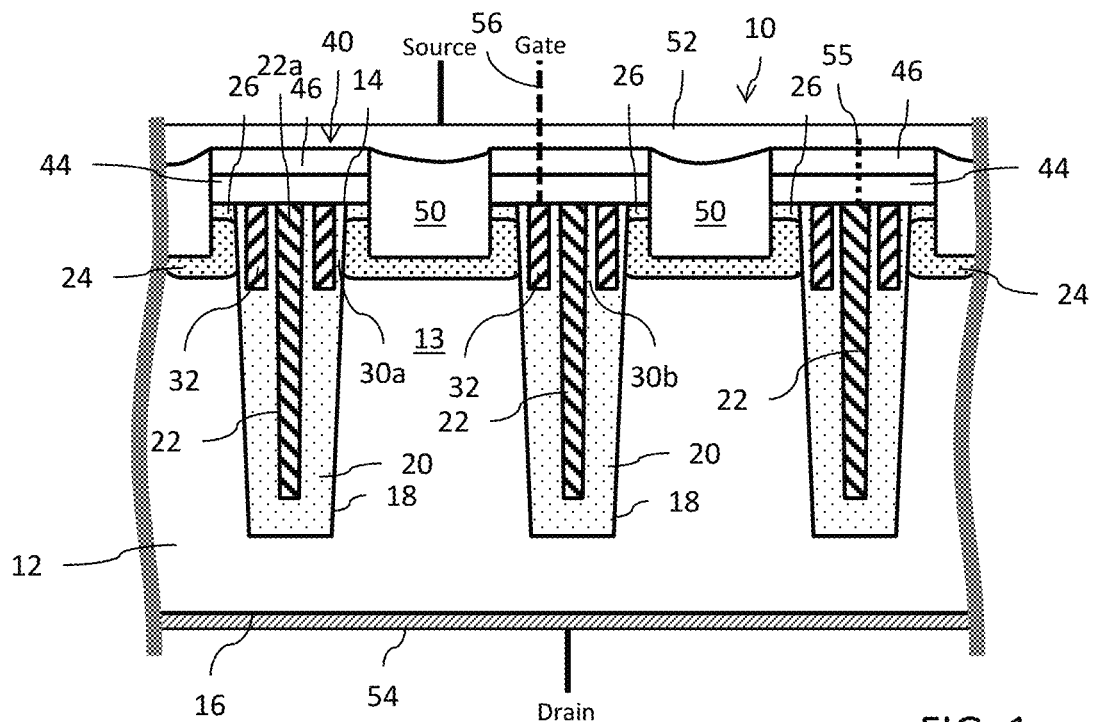
FIG. 1 is a cross-section of a power metal oxide semiconductor field effect transistor (MOSFET) device.
Figure 2:
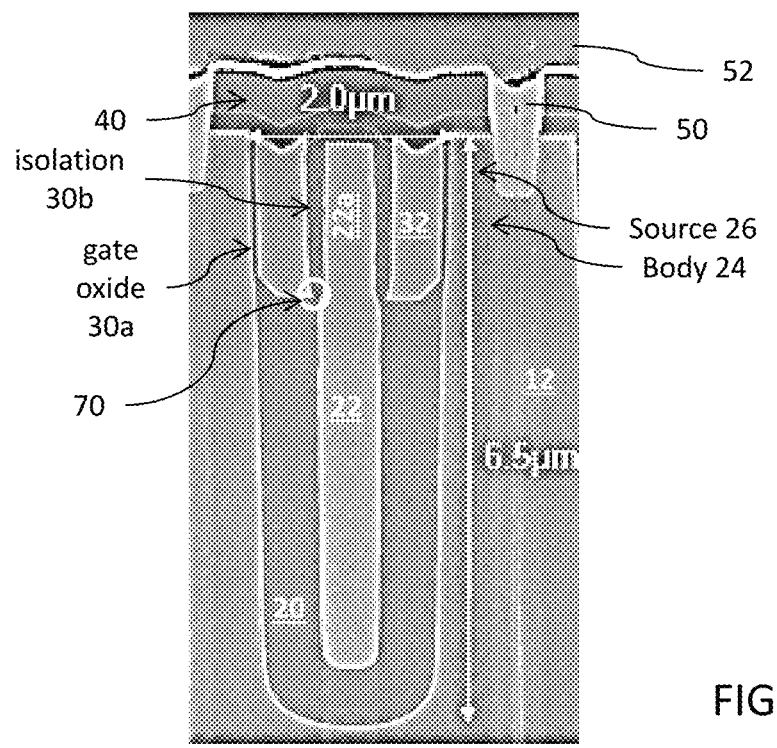
FIG. 2 is a scanning electron micrograph image of a cross-section of the power MOSFET device of FIG. 2.
Figure 3:
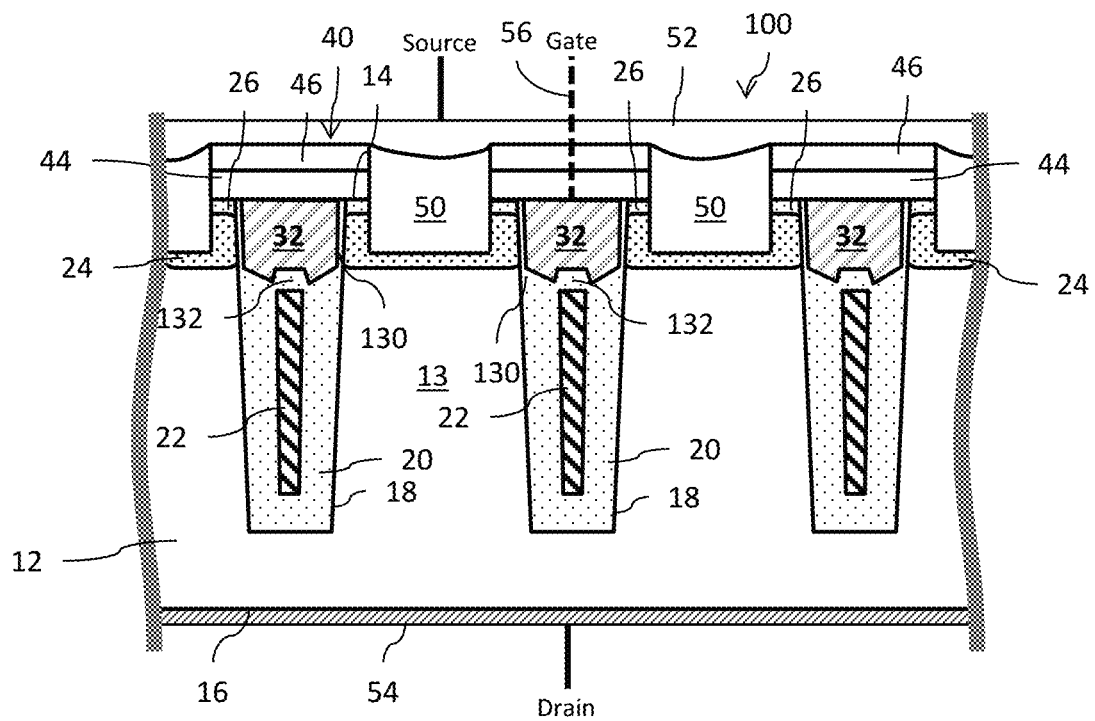
FIG. 3 is a cross-section of a power MOSFET device.

Reference is now made to FIG. 3 which shows a cross-section of an embodiment of a split-gate trench power metal oxide semiconductor field effect transistor (MOSFET) device 100. In this example, the MOSFET device 100 is an n-channel (nMOS) type device formed in and on a semiconductor substrate 12 (for example, silicon) doped with n-type dopant providing the drain region of the transistor 10. The substrate 12 has a front side 14 and a back side 16. A plurality of trenches 18 extend depthwise into the substrate 12 from the front side 14. The trenches 18 extend lengthwise parallel to each other in a direction perpendicular to the cross-section (i.e., into and out the page of the illustration), with adjacent trenches delimiting side edges of a mesa region 13 of the transistor forming a strip (this type of transistor device commonly referred to in the art as a strip-FET type transistor). Each trench 18 includes a lower part of the trench and an upper part of the trench.

A region 24 doped with a p-type dopant is buried in the mesa region 13 of the substrate 12 at a depth offset from (i.e., below) the front side 14 and positioned extending parallel to the front side 14 on opposite sides of each trench 18. The doped region 24 forms the body (channel) region of the transistor, with the trench 18 passing completely through the doped body region 24 and into the substrate 12 below the doped body region 24. A surface region 26 heavily doped with an n-type dopant is provided in the mesa region 13 at the front side 14 of the substrate 12 and positioned extending parallel to the front side 14 on opposite sides of each trench 18 and in contact with the top of the doped body region 24. The doped region 26 forms the source region of the transistor, with the trench 18 passing completely through the doped source region 26 and further extending, as noted above, completely through the doped body region 24 into the substrate 12 below the doped body region 24.

The side walls and bottom of the lower part of each trench 18 are lined with a first insulating layer 20. For example, the first insulating layer 20 may comprise an oxide layer (which, in an embodiment, is made up of an oxide thermally grown from the exposed surfaces of the substrate 12 in each trench 18 and a deposited oxide). The lower part of each trench 18 is filled by a first polysilicon material 22, with the first insulating layer 20 insulating the polysilicon material 22 from the substrate 12. During the process for fabricating the transistor 10, an upper portion of the first insulating layer 20 and upper portion of the first polysilicon material 22 (which would be adjacent to both the doped body region 24 and doped region 26, for example) are removed (i.e., recessed) from the upper part of the trench 18. This exposes a top surface of the recessed polysilicon material 22 at the bottom of the upper part of the trench 18. The side walls of the upper part of the trench 18 are lined with a second insulating layer 130 and the top surface of the recessed polysilicon material 22 is lined with a third insulating layer 132. For example, the second and third insulating layers 130, 132 may each comprise an oxide layer (which, in an embodiment, is thermally grown from the exposed surfaces of the substrate 12 in the upper part of the trench and the exposed upper end of the first polysilicon material 22). The remaining open space of the upper part of each trench 18 is then filled by a second polysilicon material 32, with the second insulating layer 130 insulating the polysilicon material 32 from the substrate 12 and the third insulating layer 132 insulating the polysilicon material 32 from the first polysilicon material 22. The first polysilicon material 22 forms a field plate electrode of the transistor 100. The second polysilicon material 32 forms the gate of the transistor 100. The second insulating layer 130 forms the gate oxide layer.

A stack 40 of layers is formed over each trench 18 and laterally extends on opposite sides of each trench 18 over at least a portion of the doped regions 26 for the source. Each stack 40 comprises a dielectric region formed by an undoped oxide (for example, tetraethyl orthosilicate (TEOS)) layer 44 and a glass (for example, borophosphosilicate glass (BPSG)) layer 46.

A source metal contact 50 extends between adjacent stacks 40 to make electrical contact with each doped source region 26. Each source metal contact 50 extends depthwise into the substrate from the front side 14 to pass through the doped source region 26 and into the doped body region 24 (thus providing a body contact for the transistor 10 that is tied to the source). A source metal layer 52 extends over both the stacks 40 and the source metal contacts 50 to provide a metal connection to all the source metal contacts 50. The stacks 40 insulate both the source metal layer 52 and the source metal contacts 50 from the gate (polysilicon region 32). An electrical connection (not explicitly shown) is provided to electrically connect the source metal layer 52 to the recessed polysilicon material 22 forming a field plate. A drain metal layer 54 extends over the back side 16 of the substrate 12 to provide a metal connection to the drain. A gate metal layer (not explicitly shown as it is offset in a direction perpendicular to the cross-section) makes an electrical connection to the gate (polysilicon region 32) in each trench 18, this gate metal layer and electrical connection being schematically shown by dotted line 56.

The transistor 100 could instead be a pMOS type transistor where the substrate 12 and doped source region 26 are both p-type doped and the body region 24 is n-type doped.

Figure 4:
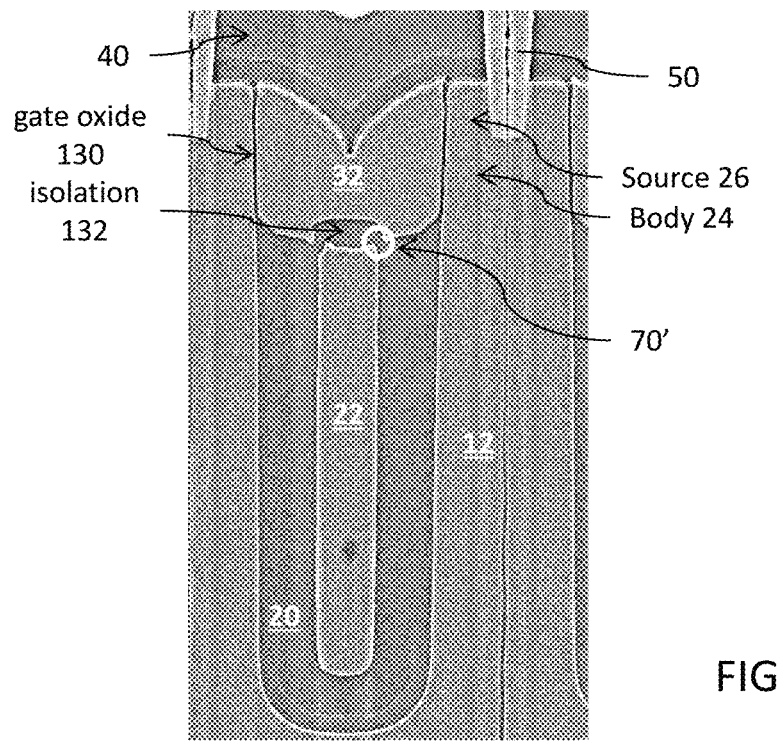
FIG. 4 is a scanning electron micrograph image of a cross-section of the power MOSFET device of FIG. 3.

A scanning electron micrograph (SEM) cross-sectional image of a single cell of the transistor 100 is shown in FIG. 4. The power MOSFET 100 supports a lower threshold voltage because the thickness of the gate oxide formed by the second insulating layer 130 between the gate (polysilicon region 32) and the substrate 12 in the trench 18 can be controlled to be thin. As an example, the thickness of the gate oxide may be in the range of about 450-500 Å. The position and thickness of the third insulating layer 132 can also be controlled to provide sufficient insulation between the gate (polysilicon region 32) and the field plate electrode (polysilicon region 22) to produce a strong poly-to-poly isolation in the region 70' necessary for achieving a desired level of gate-to-source leakage current (IGSS).

Reference is now made to FIGS. 5A-5I which show process steps in the fabrication of the MOSFET device of FIG. 3.

Figure 5A:
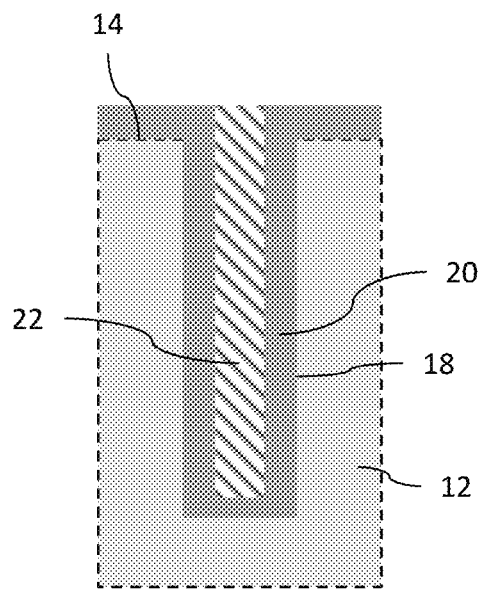
FIGS. 5A-5I show process steps in the fabrication of the MOSFET device of FIGS. 3-4.

A trench 18 is formed in a substrate 12. The sidewalls and bottom of the lower part and upper part of the trench 18 are lined with an insulating layer 20 that further extends on the front side 14 of the substrate 12. The lower and upper parts of the trench 18 are then filled with first polysilicon (conductive) material 22. A polishing operation (for example, a chemical-mechanical polishing (CMP)) is performed to remove the first polysilicon material 22 which is not located within the trench 18. The result is shown in FIG. 5A.

Figure 5B:
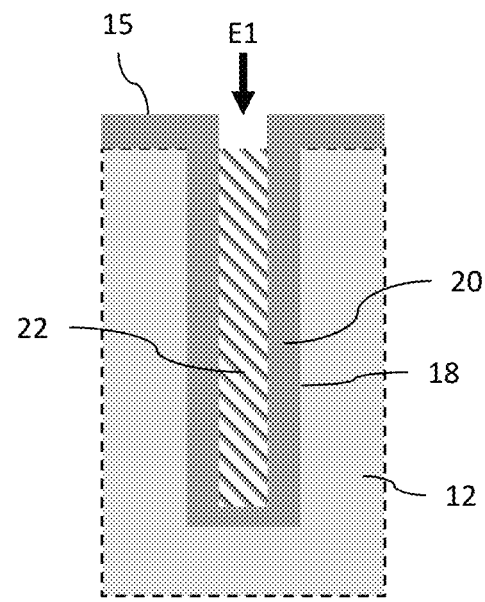

Next, an etching operation E1 is performed to recess the first polysilicon material 22 below a level of the top surface 15 of the insulating layer 20. The result is shown in FIG. 5B. More specifically, the etching performed at this step is a reactive ion etch (RIE).

Figure 5C:
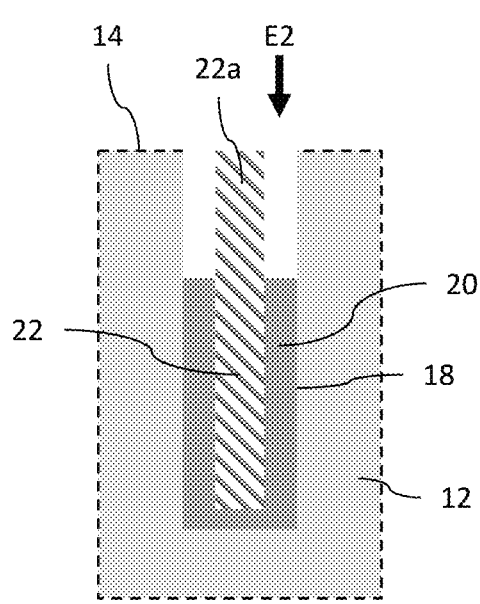

An etching operation E2 is then performed to recess the insulating layer 20 within the upper part of the trench 18 and expose an upper portion 22a of the first polysilicon material 22 within an annular trench portion of the upper part of the trench 18. The result is shown in FIG. 5C. More specifically, the etching performed at this step is by a buffered oxide etch (BOE).

Figure 5D:
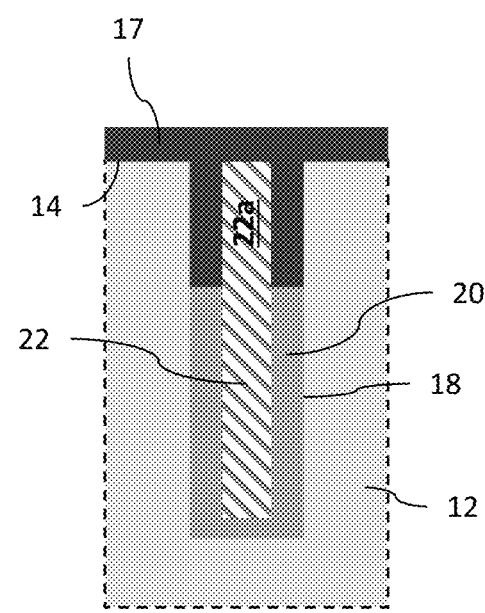

A resist layer 17 is then deposited to fill the area of trench 18 where the insulating layer 20 was recessed (i.e., the annular trench portion at the upper part of trench 18) and cover the front side 14 of the substrate 12. The result is shown in FIG. 5D.

Figure 5E:
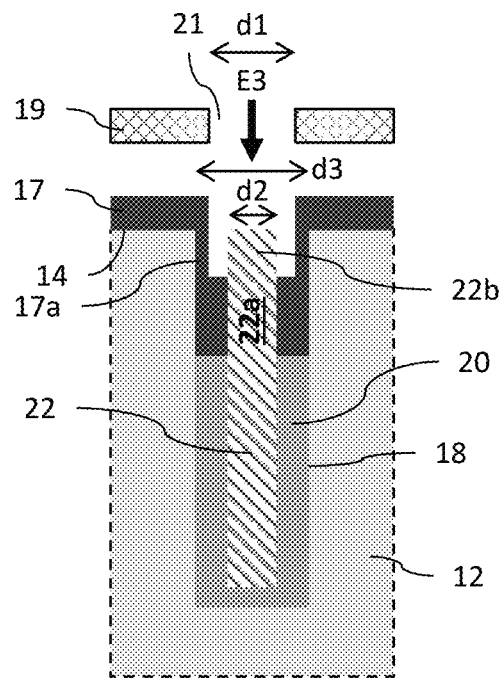
Figure 6:
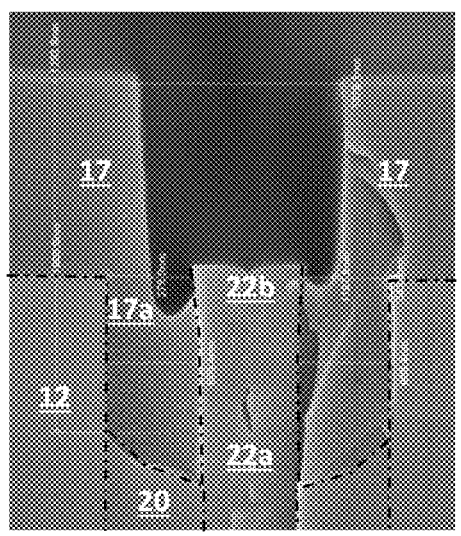
FIG. 6 is a scanning electron micrograph image of a cross-section of the trench at an intermediate step in the fabrication process shown in FIG. 5E.

A photolithography operation E3 is then performed to recess the resist layer 17 within the upper part of the trench 18 and expose an uppermost part 22b of the upper portion 22a of the first polysilicon material 22. The result is shown in FIG. 5E. FIG. 6 is a scanning electron micrograph image of a cross-section of the trench 18 at the step in the fabrication process shown by FIG. 5E. More specifically, the photolithographic operation performed at this step includes a resist under-exposure technique followed by a subsequent resist development. The reticle 19 used for performing the photolithography operation E3 includes an opening 21 that is substantially aligned with the center of the first polysilicon material 22 (with some degree of misalignment tolerated due to the use of a under-exposure photolithography technique that is to be performed) and has width dimension d1 that is greater than the width d2 of the first polysilicon material 22 and less than the width d3 of the trench 18. As a result, residual portions 17a of the resist 17 after the development in the photolithography operation E3 remain on sidewalls of the upper part of the trench 18 spaced apart from the uppermost part 22b of the upper portion 22a of the first polysilicon material 22.

During the photolithography process to develop the resist 17 using reticle 19 and its opening 21, the under-exposure photolithography (i.e., with reduced light intensity) process creates a self-aligned protection structure that ensures the annular trench portion and upper part of the substrate 12 is protected during subsequent fabrication process operations (such as, for example, the etching process E4 performed in the next step to create the recessed polysilicon 22). If this reduced under-exposure photolithography (with reduced light intensity) is not performed, and instead a standard exposure is made, the reticle opening 21 has to be designed exactly aligned to and with same dimensions as the polysilicon 22. This is very a difficult, if not impossible, process to industrialize with zero misalignment process margin.

Figure 5F:
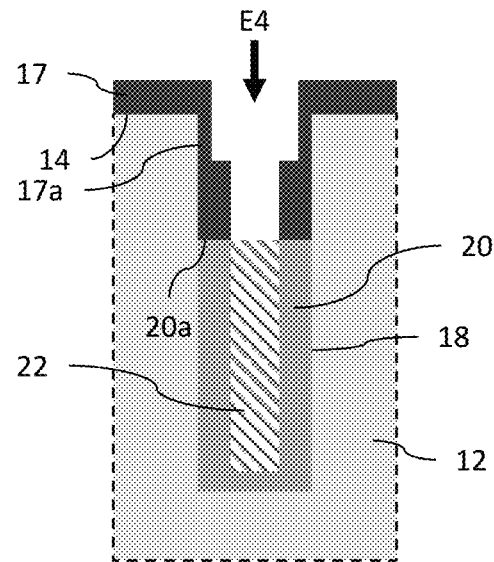

Using the mask formed by the developed resist 17, an etching operation E4 is then performed to further recess the first polysilicon material 22 (in particular, to remove the upper portion 22a of the first polysilicon material 22 within the upper part of the trench 18) to a level substantially equal to the level of an upper surface 20a of the previously recessed insulating layer 20 within the lower part of the trench 18. The result is shown in FIG. 5F. More specifically, the etching performed at this step is a reactive ion etch (RIE).

Figure 5G:
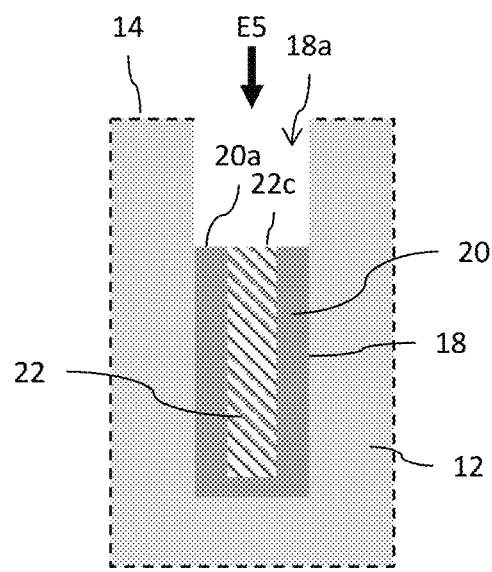

A resist removal operation E5 is then performed to remove the mask formed by the developed resist 17 and open the upper part 18a of the trench 18. The result is shown in FIG. 5G. More specifically, the resist removal performed at this step is made using a mixture of a sulfuric acid and hydrogen peroxide solution.

Figure 5H:
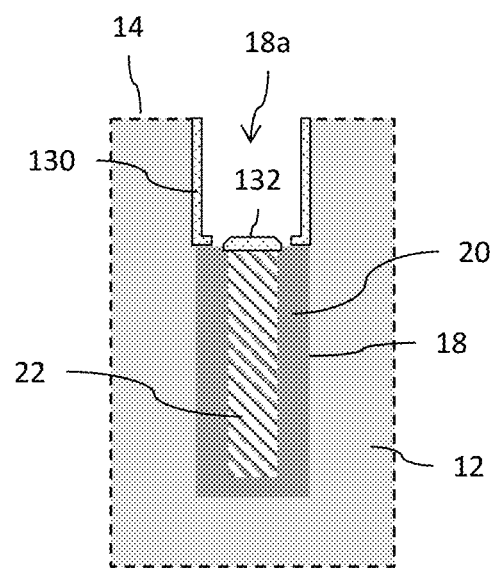

A thermal oxidation is then performed to form the second insulating layer 130 on the sidewalls of the upper part 18a of the trench 18 and the third insulating layer 132 at the bottom of the upper part 18a on the top surface 22c of the remaining portion of the first polysilicon material 22 in the lower part of the trench 18. The result is shown in FIG. 5H.

Figure 5I:
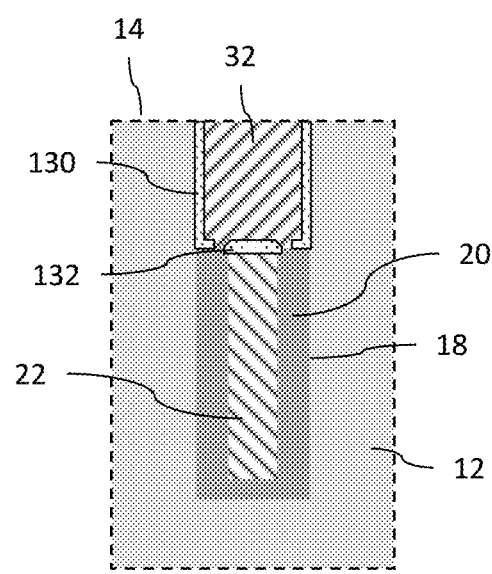

Next, the remaining open space of the upper part 18a of the trench 18 is filled with the second polysilicon (conductive) material 32. A plasma etching operation is performed to remove the second polysilicon material 32 which is not located within the upper part 18a of the trench 18. The result is shown in FIG. 5I.

The process then continues with standard fabrication techniques for completing construction of the transistor 100 (this including steps for implanting the source region 26 and body region 24). The stack 40 is deposited on the planarized surface of the substrate. Openings for the source-body contacts are then formed to extend through the stack 40 and into the substrate 12. The openings are then filled with the material for the source contact 50. The source layer 52 is then deposited over the stack 40 and source contact 50. At any suitable time in the process, the drain contact 54 may be deposited on the back side 16 of the substrate 12. The result of these standard fabrication techniques is shown in FIG. 3.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A method, comprising:
   forming a trench in a semiconductor substrate;
   lining the trench with a first insulation layer;
   filling the trench with a first conductive material insulated from the semiconductor substrate by said first insulating layer;
   recessing the first insulation layer to expose an upper portion of the first conductive material within an annular trench portion of said trench;
   filling the annular trench portion with a resist material;
   developing the resist material in the annular trench portion to expose an uppermost part of the upper portion of the first conductive material leaving residual resist material on sidewalls of the trench which are spaced apart from said uppermost part and define a mask;
   etching using said mask to remove the upper portion of the first conductive material to a level of the recessed first insulation layer;
   removing the residual resist material to open an upper part of said trench;
   lining sidewalls of the upper part of said trench with a second insulating layer;
   lining a top surface of the first conductive material at a bottom of said upper part of said trench with a third insulating layer; and
   depositing a second conductive material in said upper part of said trench, said second conductive material insulated from the semiconductor substrate by said second insulating layer and insulated from the first conductive material by said third insulating layer.

2. The method of claim 1, wherein the first conductive material is made of polysilicon.

3. The method of claim 1, wherein the second conductive material is made of polysilicon.

4. The method of claim 1, wherein the first insulating layer is a thermal oxide.

5. The method of claim 1, wherein the second insulating layer is a thermal oxide.

6. The method of claim 1, wherein the third insulating layer is a thermal oxide.

7. The method of claim 1, wherein the semiconductor substrate provides a drain region of a transistor, further comprising:
   forming a doped buried region in the semiconductor substrate which provides a body region of the transistor; and
   forming a doped surface region in the semiconductor substrate over the doped buried region which provides a source region of the transistor.

8. The method of claim 7, wherein the first conductive material provides a field plate electrode of the transistor and the second conductive material provides a gate electrode of the transistor.

9. The method of claim 7, further comprising:
   forming an opening extending through the doped surface region and into the doped buried region; and
   filling said opening with a third conductive material.

10. The method of claim 9, wherein the third conductive material provides a source contact for the transistor.

11. The method of claim 1, wherein developing the resist material in the annular trench portion comprises exposing the resist material to light through a reticle having an opening larger than a dimension of the uppermost part of the upper portion of the first conductive material and smaller than a dimension of the trench.

12. The method of claim 11, wherein exposing comprises using a light intensity which results in an underexposure of a portion of the resist material defined by the opening in the reticle.

13. The method of claim 12 wherein said light intensity has an exposure configured to support developed resist coverage notwithstanding misalignment of the opening in the reticle.

14. A method, comprising:
   forming a trench in a semiconductor substrate;
   lining a lower part of the trench with a first insulation layer;
   filling the lower part of the trench with a first conductive material insulated from the semiconductor substrate by said first insulating layer;

using a resist material within an upper part of said trench as a mask for an etching operation to remove the first conductive material from the upper part of said trench;

lining sidewalls of the upper part of said trench with a second insulating layer;

lining a top surface of the first conductive material at a bottom of said upper part of said trench with a third insulating layer; and depositing a second conductive material in said upper part of said trench, said second conductive material insulated from the semiconductor substrate by said second insulating layer and insulated from the first conductive material by said third insulating layer.

15. The method of claim 14, wherein the first and second conductive materials are each made of polysilicon.

16. The method of claim 14, wherein the first, second and third insulating layers are each made of a thermal oxide.

17. The method of claim 14, wherein the semiconductor substrate provides a drain region of a transistor, further comprising:

forming a doped buried region in the semiconductor substrate which provides a body region of the transistor; and forming a doped surface region in the semiconductor substrate over the doped buried region which provides a source region of the transistor.

18. The method of claim 17, wherein the first conductive material provides a field plate electrode of the transistor and the second conductive material provides a gate electrode of the transistor.

19. The method of claim 17, further comprising:

forming an opening extending through the doped surface region and into the doped buried region; and filling said opening with a third conductive material.

20. The method of claim 19, wherein the third conductive material provides a source contact for the transistor.

21. The method of claim 14, further comprising:

depositing the resist material in the upper part of said trench to surround an upper portion of said first conductive material; and developing the resist material to expose an uppermost part of the upper portion of the first conductive material leaving residual resist material on sidewalls of the upper part of said trench spaced apart from said uppermost part and define said mask.

22. The method of claim 21, further comprising removing the resist material within the upper part of said trench following the etching operation to remove the first conductive material from the upper part of said trench.

23. The method of claim 21, wherein developing the resist material comprises exposing the resist material to light through a reticle having an opening larger than a dimension of the uppermost part of the upper portion of the first conductive material and smaller than a dimension of the trench.

24. The method of claim 23, wherein exposing comprises using a light intensity which results in an underexposure of a portion of the resist material defined by the opening in the reticle.

25. The method of claim 24, wherein said light intensity has an exposure configured to support developed resist coverage notwithstanding misalignment of the opening in the reticle.

\* \* \* \* \*